United States Patent [19]
Barron et al.

[11] Patent Number: 5,919,548
[45] Date of Patent: *Jul. 6, 1999

[54] CHEMICAL-MECHANICAL POLISHING OF RECESSED MICROELECTROMECHANICAL DEVICES

[75] Inventors: Carole C. Barron; Dale L. Hetherington; Stephen Montague, all of Albuquerque, N.M.

[73] Assignee: Sandia Corporation, Albuquerque, N.M.

[*] Notice: This patent is subject to a terminal disclaimer.

[21] Appl. No.: 08/915,071

[22] Filed: Aug. 20, 1997

Related U.S. Application Data

[63] Continuation-in-part of application No. 08/729,122, Oct. 11, 1996.
[51] Int. Cl.[6] .................................................. B32B 3/04
[52] U.S. Cl. ...................... 428/138; 438/691; 438/692; 438/695; 438/697
[58] Field of Search .................................... 438/690, 691, 438/692, 695, 697; 428/138

Primary Examiner—Benjamin Utech
Assistant Examiner—Kin-Chan Chen
Attorney, Agent, or Firm—John P. Hohimer

[57] ABSTRACT

A method is disclosed for micromachining recessed layers (e.g. sacrificial layers) of a microelectromechanical system (MEMS) device formed in a cavity etched into a semiconductor substrate. The method uses chemical-mechanical polishing (CMP) with a resilient polishing pad to locally planarize one or more of the recessed layers within the substrate cavity. Such local planarization using the method of the present invention is advantageous for improving the patterning of subsequently deposited layers, for eliminating mechanical interferences between functional elements (e.g. linkages) of the MEMS device, and for eliminating the formation of stringers. After the local planarization of one or more of the recessed layers, another CMP step can be provided for globally planarizing the semiconductor substrate to form a recessed MEMS device which can be integrated with electronic circuitry (e.g. CMOS, BiCMOS or bipolar circuitry) formed on the surface of the substrate.

42 Claims, 9 Drawing Sheets ial is deposited on a semiconductor substrate as defined # CHEMICAL-MECHANICAL POLISHING OF RECESSED MICROELECTROMECHANICAL DEVICES

CROSS REFERENCE TO RELATED APPLICATIONS

This is a continuation-in-part of application Ser. No. 08/729,122, filed Oct. 11, 1996 now U.S. Pat. No. 5,804 084. That application is herein incorporated by reference. This invention is further related to application Ser. No. 08/524, 700, filed Sept. 6,1995 now U.S. Pat. No. 5,798,283 which is incorporated herein by reference.

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates to a method of micromachining for fabricating microelectromechanical systems (MEMS), and more particularly to a chemical-mechanical polishing method for locally planarizing one or more layers of micromachinable materials used to form a MEMS device recessed in a cavity below a surface of a semiconductor substrate.

BACKGROUND OF THE INVENTION

Microelectromechanical systems (MEMS) are devices fabricated using integrated-circuit (IC) and silicon micromachining technology, with overall dimensions on the order of a millimeter and with minimum feature sizes on the order of microns. As successive layers of micromachinable materials are deposited and patterned to form one or more levels of a MEMS device, the surface topography becomes increasingly irregular and pronounced due to deposited material draping into valleys created by each underlying patterned layer of the MEMS device. This surface topography can be detrimental since it imposes limitations on photolithography, deposition, patterning and etching of subsequent layers. The resultant surface topography can further lead to mechanical interferences between moveable parts (e.g. gears, rotors, linkages, levers) on two or more functional levels of the MEMS device. Finally, the irregular surface topography can lead to the formation of stringers which are material remnants left over after an anisotropic etching step that fails to remove completely a vertically oriented portion of material in a particular layer (e.g. polysilicon) of the MEMS device. Such stringers can break loose, causing mechanical interference with moveable elements of the MEMS device, or causing an electrical short circuit in the MEMS device.

What is needed is a method for substantially planarizing the various levels of a MEMS device during formation thereof to minimize any unwanted surface topography at each level of the device. Such planarization is further complicated in the case of a MEMS device having recessed layers formed within a substrate cavity since the chemical-mechanical polishing (CMP) as used heretofore has not addressed the local planarization of recessed layers within a cavity.

Chemical-mechanical polishing has been used heretofore to provide a rapid and effective method for globally planarizing semiconductor substrates primarily for forming integrated circuits (ICs). For trench isolation of ICs, a deposited dielectric material such as silicon dioxide can be deposited to over-fill trenches separating transistors or other elements of the ICs. Chemical-mechanical polishing can then be used to polish back the silicon dioxide to level the trench with the substrate surface. Such trench isolation by CMP allows a device packing density in ICs to be increased, and also helps to prevent photolithography problems which would otherwise occur if the surface topography were to exceed the depth of focus of a stepper exposure system as successive layers of an IC structure are deposited and patterned. Thus, the goal of CMP heretofore has been to remove any excess deposited trench-fill material protruding above one or more trenches thereby planarizing the trenches so that the trench-fill material is flush with the surface of the semiconductor substrate. Any removal of material from inside the trench (termed dishing) below the substrate surface has heretofore been undesirable since it would defeat the purpose of global planarization of the substrate. In other words, it has been antithetical to planarization as known and taught heretofore to have material removed from within a trench or cavity during a chemical-mechanical polishing process step to locally planarize one or more recessed layers.

An advantage of the present invention is that a chemical-mechanical polishing step can be used to locally planarize one or more levels of a microelectromechanical (MEMS) device during formation thereof.

Another advantage of the present invention is that a multilayer MEMS device can be formed in a cavity etched into a semiconductor substrate with one or more recessed layers (e.g. sacrificial layers or polysilicon layers) of the MEMS device being locally planarized by CMP, and with the MEMS device further being encapsulated by a sacrificial material so that the semiconductor substrate can be globally planarized by CMP.

A further advantage of the present invention is that the use of CMP for locally planarizing one or more recessed layers of a MEMS device can eliminate mechanical interference between functional (i.e. moveable) elements within the MEMS device, and can further eliminate stringers that can lead to premature device failure.

These and other advantages of the method of the present invention will become evident to those skilled in the art.

SUMMARY OF THE INVENTION

The present invention relates to a method of micromachining a multilayer microelectromechanical system, also termed a MEMS device or a micromachine. The method comprises steps for forming a cavity in a semiconductor substrate wherein the MEMS device is to be formed; forming a first level of the MEMS device within the cavity; depositing a first layer of a sacrificial material to blanket the first level of the MEMS device; locally planarizing at least a portion of an upper surface of the first layer of sacrificial material within the cavity by chemically-mechanically polishing the first layer of sacrificial material; and forming a second level of the MEMS device above the first layer of sacrificial material, with the second level of the MEMS device being operatively connected (i.e. electrically connected and/or mechanically supported or engageable) to the first level of the MEMS device. In preferred embodiments of the present invention, a step for patterning the first layer of sacrificial material by etching is provided prior to the step for forming the second level of the MEMS device. This patterning of the first layer of sacrificial material allows the formation of shaped openings therein for molding or shaping functional elements in the second level of the MEMS device during deposition thereof for forming electrical or mechanical interconnections between the first and second levels of the MEMS device, or for forming engageable elements (e.g. meshed gears, engagement pins or coupled linkages) of the MEMS device.

The present invention eliminates topography problems inherent in multi-level micromachining processes by the application of chemical-mechanical polishing (CMP) to one or more sacrificial layers deposited to separate various functional levels of a MEMS device during fabrication thereof.

In a MEMS device, deposited layers of a sacrificial material (e.g. silicon dioxide) can be used to separate different functional levels of the device. Since each sacrificial layer is deposited over a functional level that has been patterned to provide one or more functional elements therein, the sacrificial layer as deposited is non-planar with valleys being formed therein due to the deposited sacrificial material being draped over the functional elements. In a preferred embodiment of the present invention, these valleys in the sacrificial layer are substantially eliminated, at least in a central portion of the sacrificial layer above which another functional level of the MEMS device is to be formed. This can be achieved by depositing the sacrificial layer to completely cover the functional elements in the level below, with a low point of each valley formed in an upper surface of the sacrificial layer preferably being above all of the functional elements in the level below. Chemical-mechanical polishing can then be used to polish away some of the sacrificial layer thereby substantially planarizing at least the central portion of the sacrificial layer. The CMP process step can be terminated somewhat above the functional elements in the first level (i.e. the first-level functional elements), at the top of the first-level functional elements, or part of the way into the first-level functional elements depending upon the requirements of the successive functional level and whether or not elements in that level are to be electrically or mechanically connected or engageable with one or more functional elements in the level below. The planarized sacrificial layer provides a smooth surface on which to form the functional elements in a second-formed level of the MEMS device. This process can be repeated as each successive sacrificial layer is deposited so that the valleys in each deposited sacrificial layer are overcome to eliminate problems due to any unwanted topography. Additionally, the method of the present invention can be used to planarize materials (e.g. polysilicon, silicon nitride, metals or metal alloys) deposited within the cavity for forming one or more of the functional levels of the MEMS device (e.g. to form a recessed mirror from a polysilicon or metal layer).

The method of the present invention can further include a step for depositing a polishing-stop layer on the surface of the semiconductor substrate. The polishingstop layer can be deposited after forming the cavity by etching, in which case, the polishing-stop layer can be blanket deposited over the substrate, extending into the cavity and lining the cavity to form an etch-stop layer therein. The etch-stop layer is useful during a later etch release step whereby the sacrificial material which encapsulates the MEMS device is removed by etching, thereby releasing the MEMS device for operation.

Additionally, the method of the present invention can include steps for blanket depositing one or more additional layers of sacrificial material above the second level of the MEMS device, and locally planarizing the sacrificial material above the second level by another chemical-mechanical polishing (CMP) step. In some preferred embodiments of the present invention, the sacrificial material above the second level is blanket deposited over the semiconductor substrate, over-filling the cavity containing the MEMS device so that a CMP step can be used for globally planarizing the semiconductor substrate. Such global planarization is particularly advantageous when electronic circuitry is to be formed on the surface of the semiconductor substrate.

Additional advantages and novel features of the invention will become apparent to those skilled in the art upon examination of the following description, or can be learned by practice of the invention. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
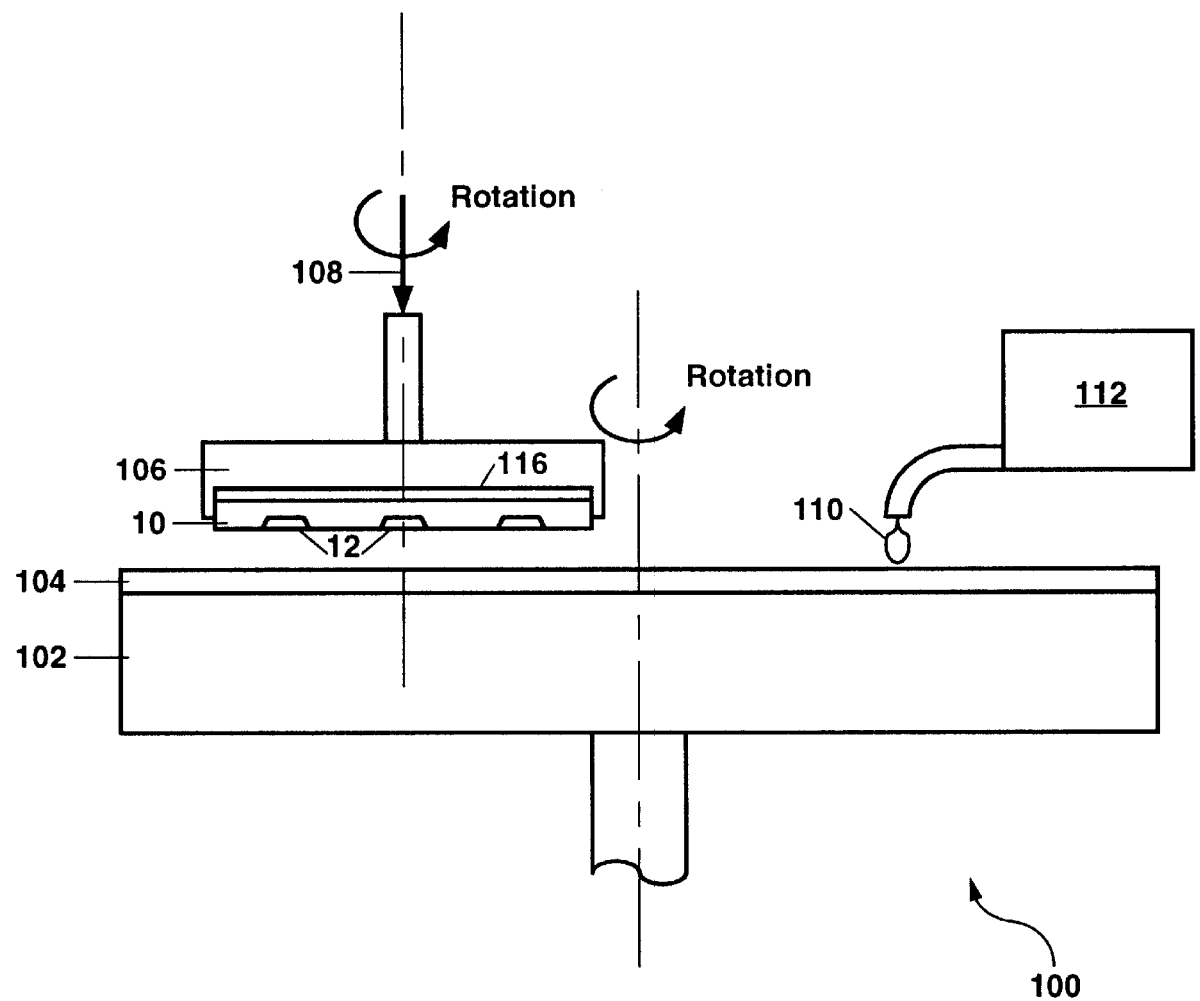
FIG. 1 shows a schematic cross-section view of a chemical-mechanical polishing apparatus for locally planarizing a MEMS device formed in a cavity in a semiconductor substrate according to the present invention.

Referring to FIG. 1, there is shown a chemical-mechanical polishing (CMP) apparatus 100 for locally planarizing one or more MEMS devices during formation thereof on a semiconductor substrate 10 within a cavity 12. The substrate 10 in FIG. 1 is not drawn to scale and does not show one or more material layers within each cavity 12 that are to be locally planarized by the CMP apparatus 100.

In FIG. 1, the CMP apparatus 100 includes a rotatable polishing platen 102 upon which a resilient polishing pad 104 is mounted. A rotatable wafer carrier 106 is used to hold the semiconductor substrate 10 with each cavity 12 facing downward and to urge the substrate 10 into contact with the polishing pad 104 by means of an applied pressure 108. A polishing slurry 110 is dispensed onto the polishing pad 104 from a reservoir 112, generally saturating the polishing pad 104. In the CMP process of the present invention, the semiconductor wafer 10 is polished by contact with the polishing pad 104 and slurry 110 under controlled conditions, thereby locally planarizing a recessed layer in the cavity 12 during formation of the MEMS device. The polishing performance achievable with the present invention depends on several parameters: polish pad composition (i.e. resiliency), slurry composition and temperature, rotational speeds of the polishing platen and semiconductor substrate carrier, downward pressure applied to the semiconductor substrate, size of the cavity containing the recessed layer of the MEMS device to be locally planarized, and the composition of each material layer to be polished. Adjustment of these parameters permits control of the CMP process described herein.

Figure 2:
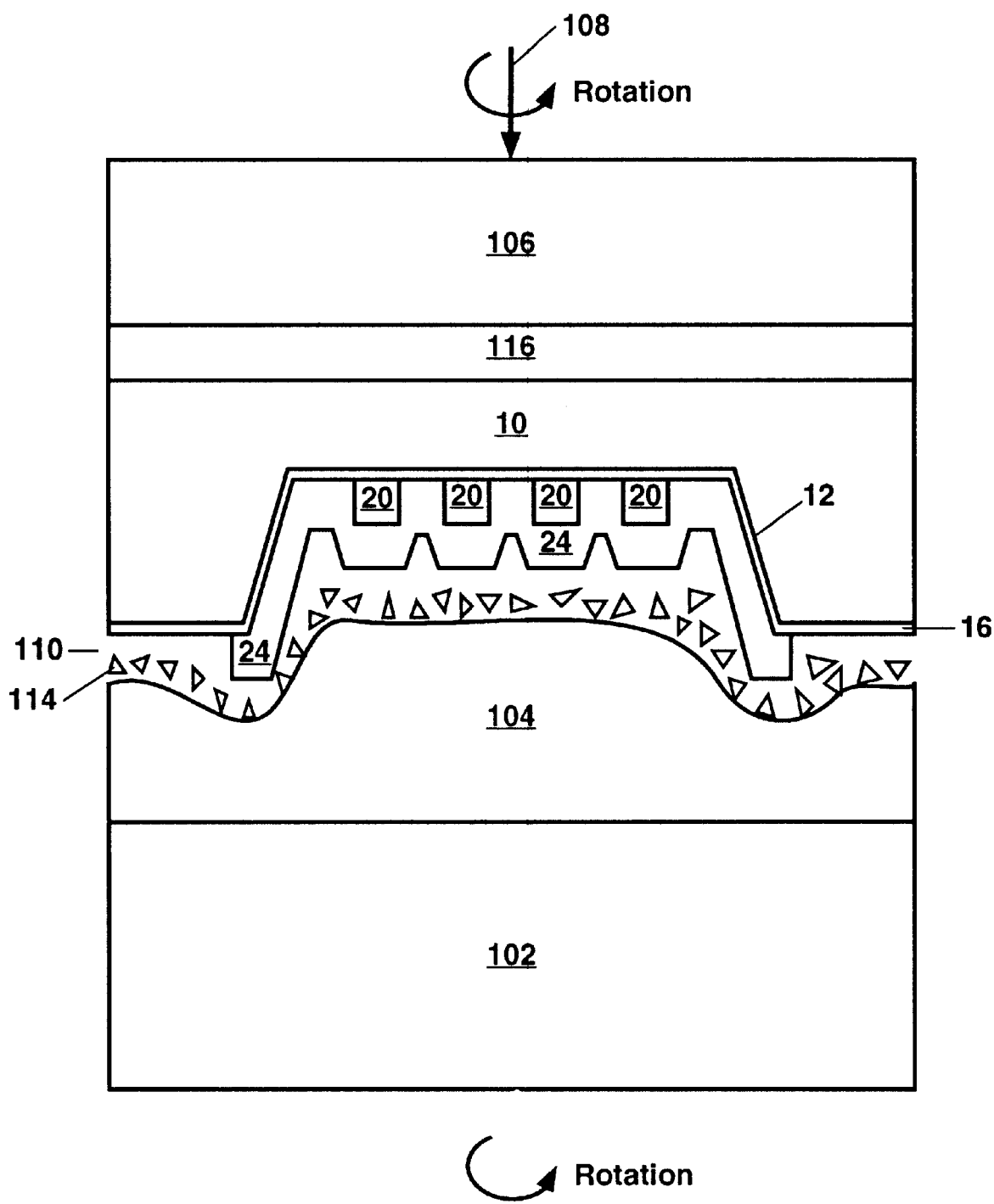
FIG. 2 shows an enlarged schematic cross-section view of portions of the substrate and chemical-mechanical polishing apparatus of FIG. 1 for describing a chemical-mechanical polishing process step for locally planarizing a deposited material layer within the substrate cavity.

FIG. 2 shows a schematic representation of a CMP process step according to the present invention wherein a first-deposited layer 24 of a sacrificial material (i.e. a first sacrificial layer) is locally planarized within the substrate cavity 12 using the CMP apparatus 100 of FIG. 1. In FIG. 2, The resilient polishing pad 104 containing a polishing slurry 110 is rotated at a predetermined speed (generally between about 10 to 70 rpm) by a motor-driven platen 102. The semiconductor substrate 10 is held by wafer carrier 106 which is rotated at another predetermined speed (generally between about 25 and 90 rpm). An optional carrier insert 116 as shown in FIG. 2 can be provided between the semiconductor substrate 10 and the wafer carrier 106. The substrate 10 containing a first sacrificial layer 24 with a recessed surface to be polished is urged into contact with the pad 104 and slurry 110, and polishing proceeds until a desired level of planarization of the recessed surface is achieved.

In FIG. 2, the polishing slurry 110 contains abrasive particles 114 that are urged into contact with the first sacrificial layer 24 due to the resilience of the polishing pad 104 and the applied downward pressure 108 which can be between about 2 to 12 psi. The abrasive particles 114 which are generally much smaller than the size of the cavity 12 mechanically remove material from the first sacrificial layer 24 by abrasion while chemicals (e.g. potassium hydroxide) in the slurry chemically remove material from the layer 24 by oxidizing and/or etching the sacrificial material comprising the layer 24. This results in a local planarization of the first sacrificial layer 24. The first sacrificial layer 24 is generally formed within the cavity 12, but can also extend outward from the cavity 12 to cover at least a portion of the semiconductor wafer 10 outside the cavity 12.

In FIG. 2, the polishing slurry can comprise, for example, a colloidal-fumed silica slurry (e.g. a Cabot SS-12 slurry). It is known that colloidal silica, as dispersed in an alkaline polishing slurry (e.g. comprising potassium hydroxide) has an optimum stability at a pH in the range of about pH=8 and pH=11, since a negative charge is then formed on the surface of the colloidal silica particles which creates an electrostatic repulsion between the particles that prevents agglomeration and thereby stabilizes the colloid. The theory of chemical-mechanical polishing of the first sacrificial layer 24 comprising an oxide (e.g. silicon dioxide or a silicate glass) is not well understood. However, it is generally accepted that the alkaline chemistry hydrolyzes the surface and sub-surface of an oxide layer, thereby weakening its $SiO_2$ bond structure. The mechanical abrasion provided by the abrasive particles 114 in the slurry 110 through applied pressure and rotation causes high features on the first sacrificial layer 24 to erode at a faster rate than low features (i.e. valleys), thereby planarizing the surface of the first sacrificial layer 24 over time.

In FIG. 2, the polishing pad 104 must be resilient enough so that the pad can deflect into the cavity 12 sufficiently to bring the abrasive particles 114 into contact with the recessed surface of the first sacrificial layer 24 in the cavity 12 for polishing thereof. Examples of polishing pads 104 that are useful with the present invention include pads comprising polyurethane, polyester felts, or a napped poromeric synthetic materials (e.g. a POLYTEX SUPREME napped poromeric polishing pad manufactured by Rodel Corp.).

Figure 3A:
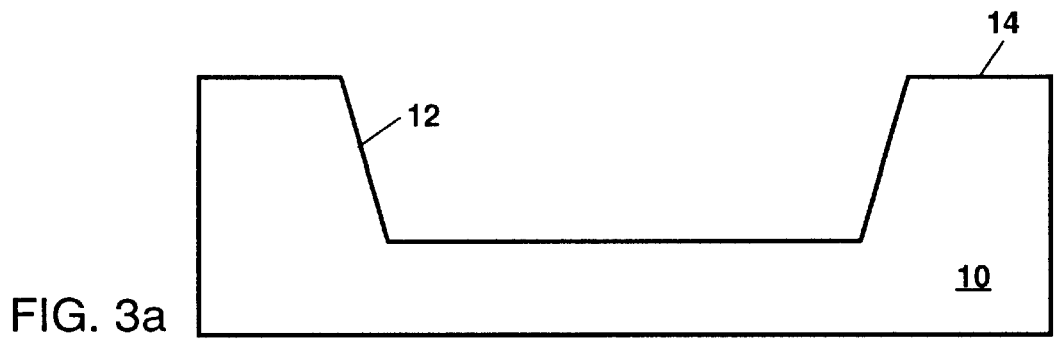
FIGS. 3$a$, 3$b$, 3$c$, 3$d$, 3$e$, 3$f$, 3$g$, 3$h$, 3$i$, 3$j$, 3$k$, 3$l$, 3$m$, 3$n$, 3$o$, 3$p$, 3$q$, and 3$r$ show schematic cross-section views of a series of process steps for forming a multilayer MEMS device in a substrate cavity by a series of micromachining steps that include one or more CMP steps for locally planarizing recessed layers according to the method of the present invention.
Figure 3B:
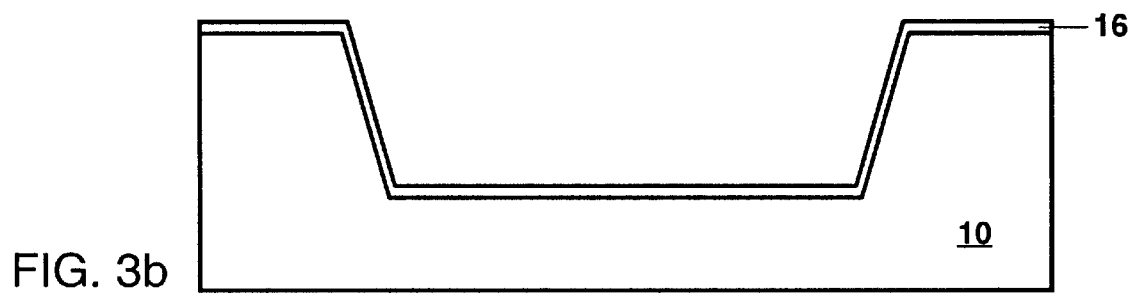
Figure 3C:
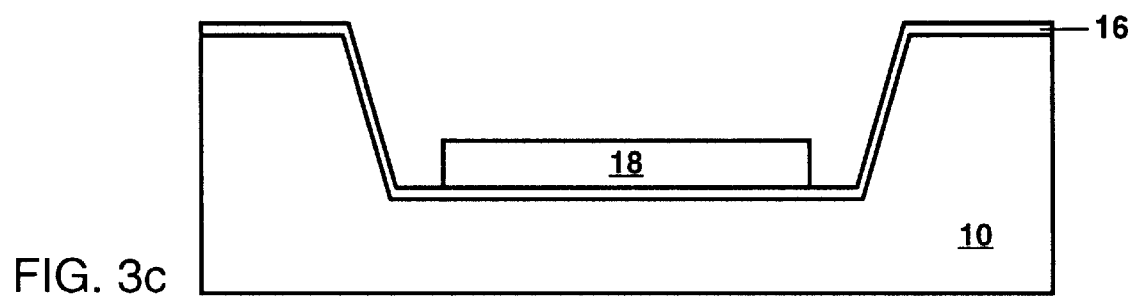
Figure 3D:
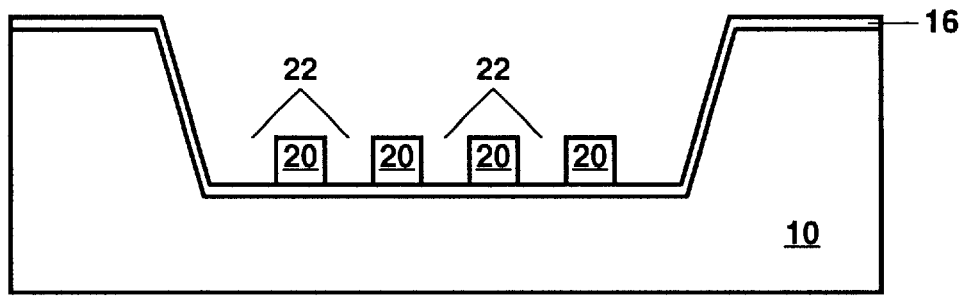
Figure 3E:
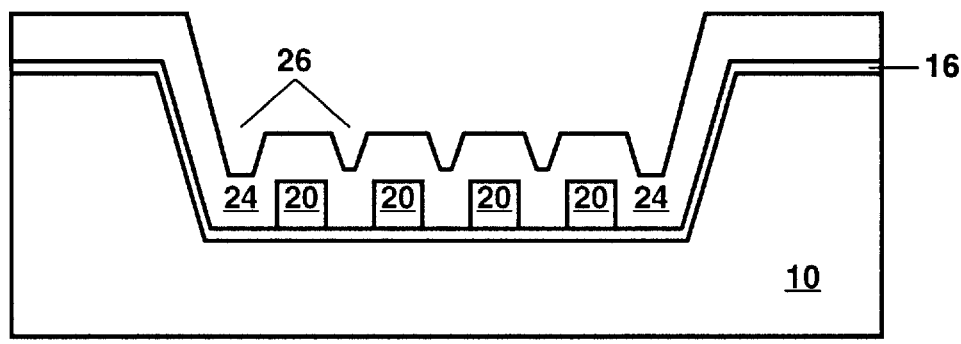
Figure 3F:
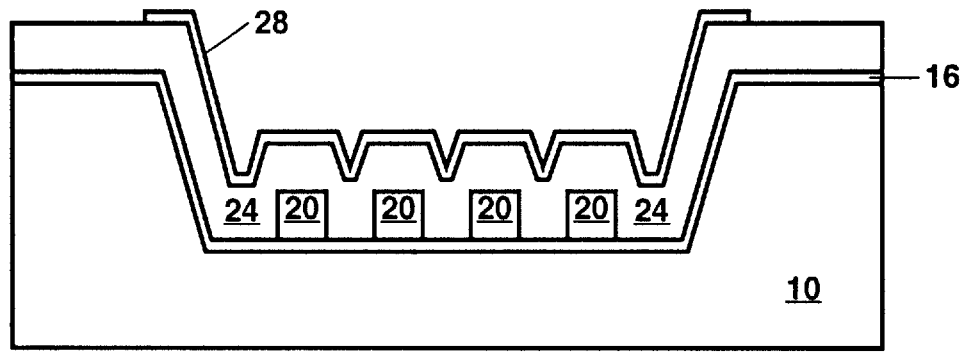
Figure 3G:
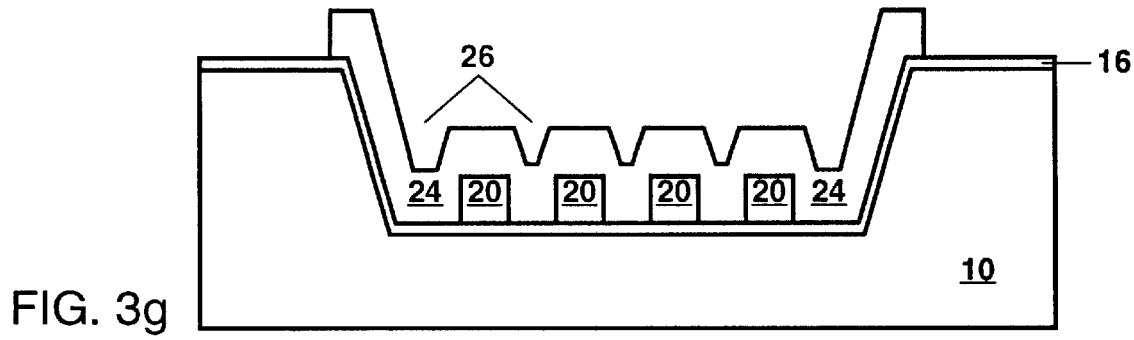
Figure 3H:
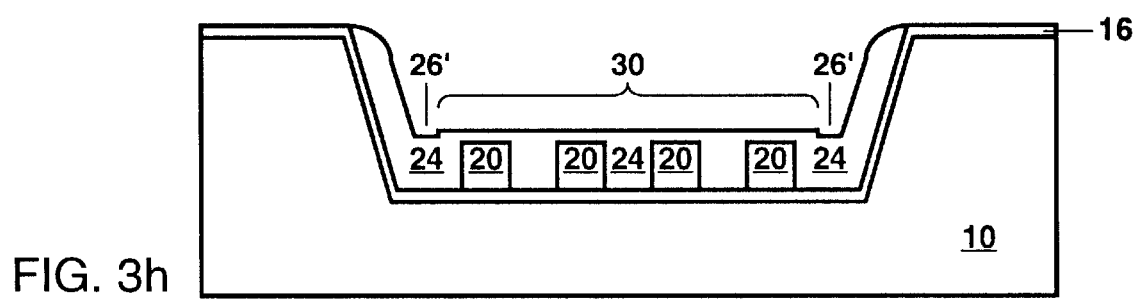
Figure 3I:
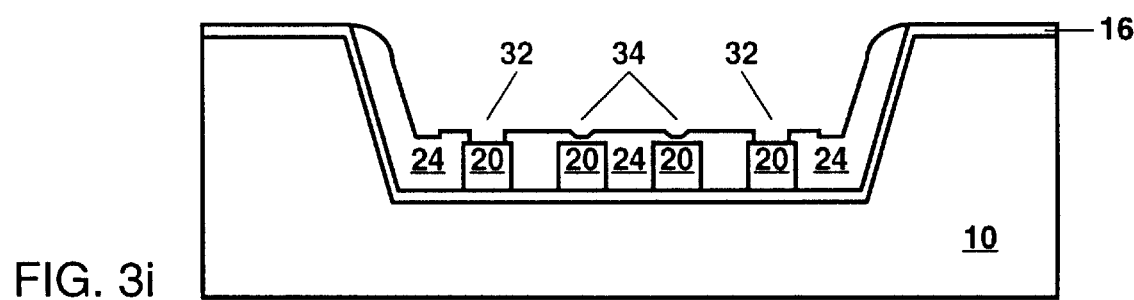
Figure 3J:
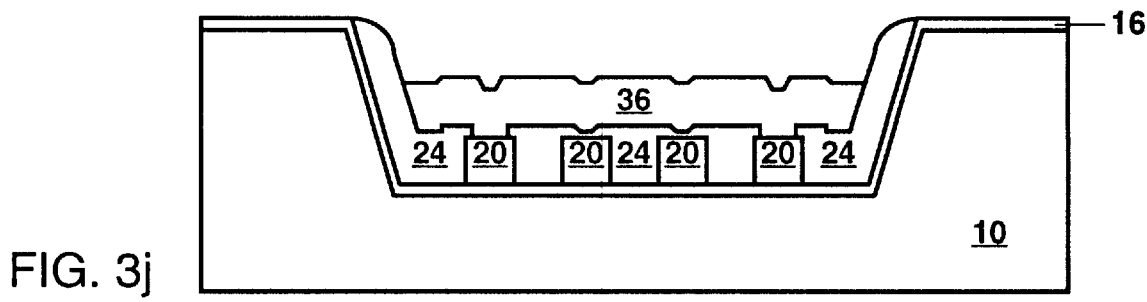
Figure 3K:
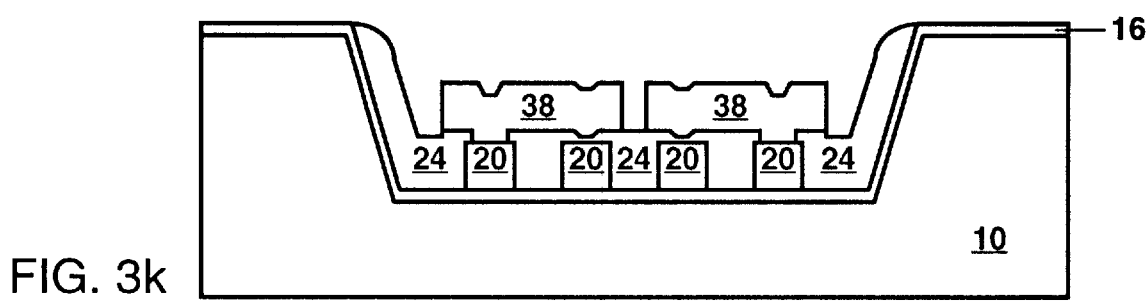
Figure 3L:
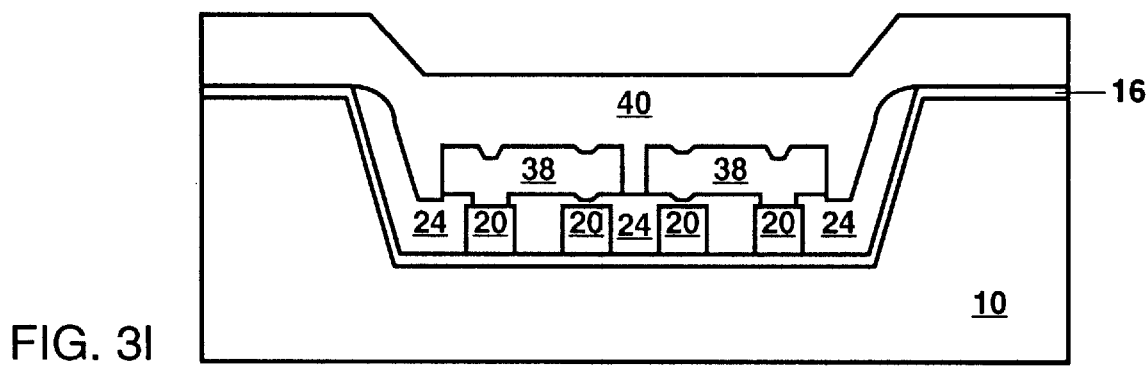
Figure 3M:
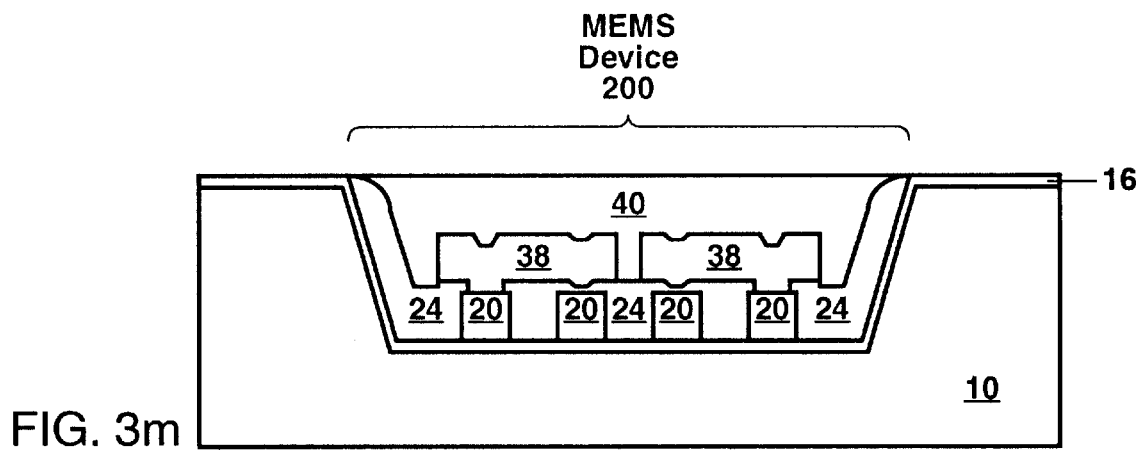
Figure 3N:
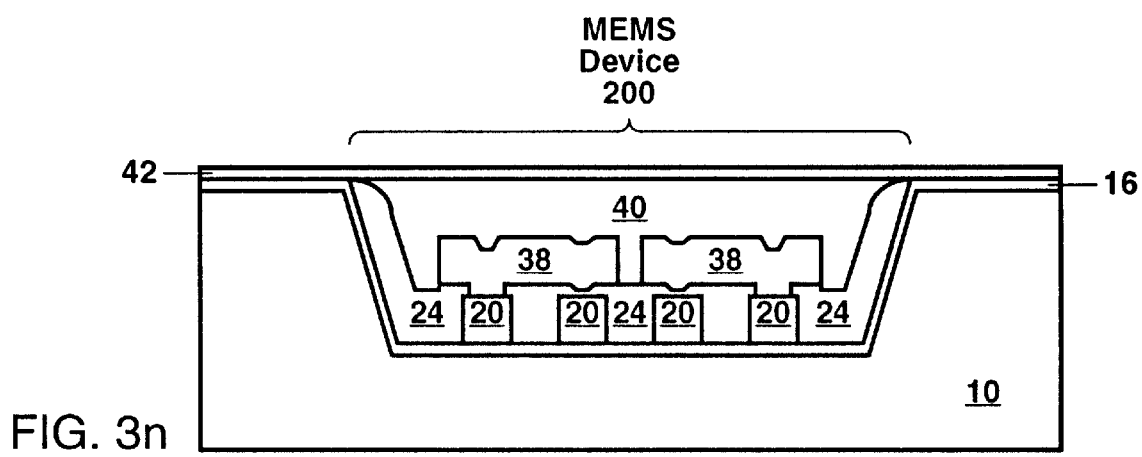
Figure 3O:
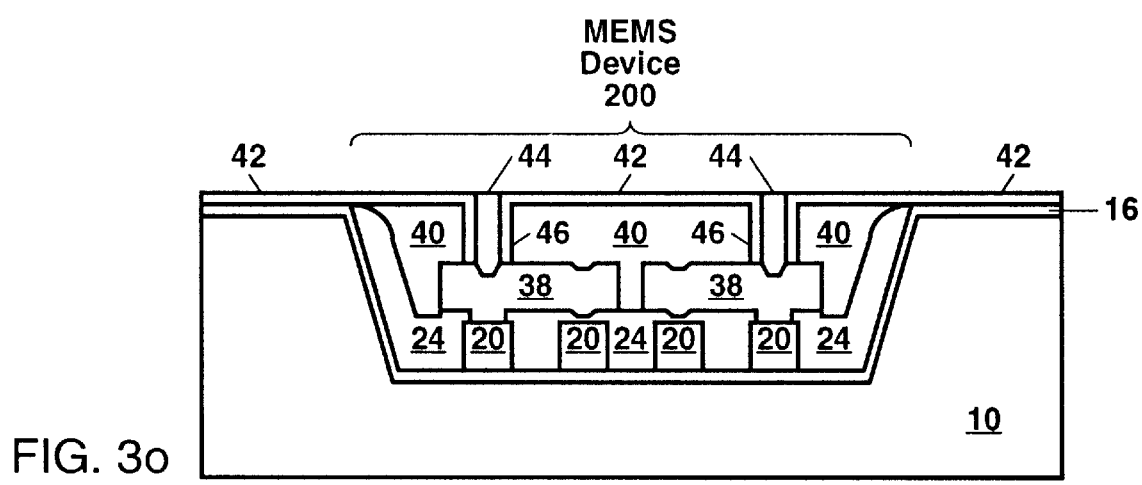
Figure 3P:
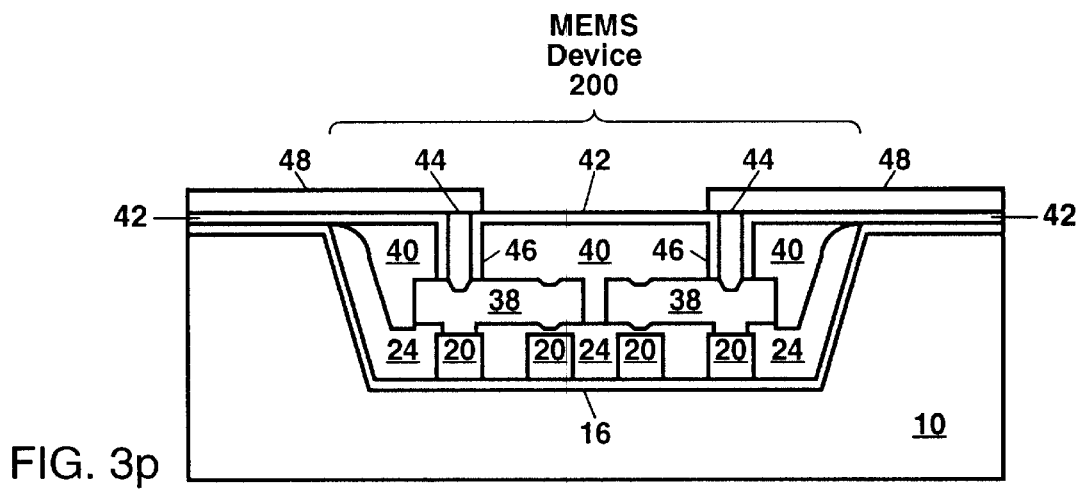
Figure 3Q:
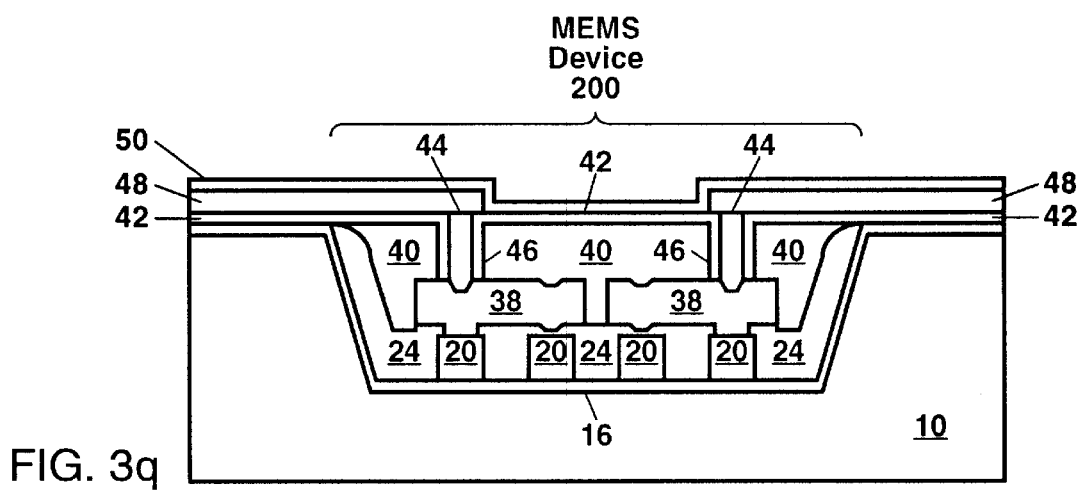
Figure 3R:
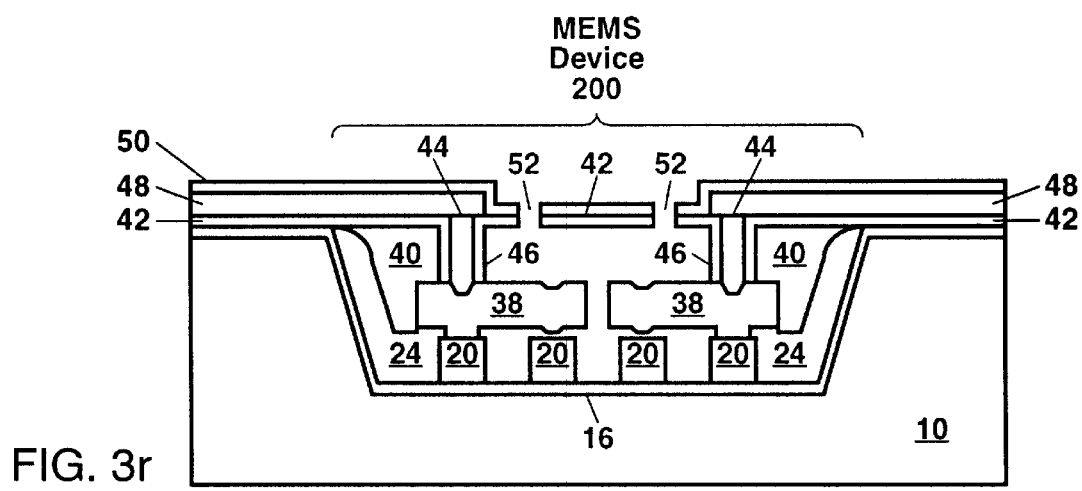

FIGS. 3a–3r show schematic cross-section views of a series of process steps for forming a multilayer MEMS device 200 in a substrate cavity by a series of micromachining steps that include one or more CMP steps for locally planarizing recessed layers according to the method of the present invention. It will be understood that FIGS. 3a–3r are schematic representations for illustrating the method of the present invention which are of general application for forming many different types of MEMS devices within a substrate cavity. In particular, the present invention is applicable to the formation of MEMS devices having two or more levels of functional elements (i.e. two or more levels of a micromachinable material such as polycrystalline silicon, also termed polysilicon, containing structural elements that are operatively connected to provide an electrical or mechanical interaction between the levels whereby a predetermined functionality is provided).

Simple flexural structures such as comb drives or accelerometers can be built with a single level of functional elements to provide a limited functionality such as capacitive sensing (e.g. a MEMS accelerometer). In MEMS devices containing two or more levels of functional elements, more complicated micromachines can be formed containing, for example, gear trains, levers, linkages or combinations thereof to provide increased functionality. The provision of at least three levels of functional elements is required to create useful motion between gears using linkages.

As height differentials in the surface topography build up with increased numbers of functional levels, it becomes more and more difficult, if not impossible, to produce workable linkages between gears and other elements as the linkages drape into valleys between the functional elements made in preceding steps. At some point the linkages begin to interfere with other of the functional elements, or become so distorted as to have insufficient strength for reliable functioning. The surface topography can also impose limitations on patterning and etching of subsequent layers, and can lead the formation of unwanted stringers that can also be detrimental to device reliability.

FIGS. 3a–3r describe the formation of a MEMS device 200 by a series of process steps that are designed to minimize or eliminate these valleys so that interferences between linked functional elements can be avoided. It will be understood that the series of process steps described herein have been limited for clarity to only those process steps that are essential for understanding the present invention and do not include other process steps (e.g. photolithographic mask formation and removal steps) which are well known to the art and, therefore, need not be described in detail herein.

FIG. 3a shows a semiconductor substrate 10 in which one or more open cavities 12 are formed by etching. The semiconductor substrate 10 generally comprises monocrystalline silicon which can be either doped (i.e. n- or p-type doped) or undoped depending upon the type of MEMS device 200 to be formed within the cavity 12, and whether or not electronic circuitry is to be formed on the substrate 10 and interconnected with the MEMS device. The semiconductor substrate 10 as defined herein can further include a surface or buried epitaxial silicon layer of generally about 2–10 microns thickness to provide high-quality material for forming the MEMS device 200, or for forming electronic circuitry (e.g. CMOS, BiCMOS, or bipolar circuitry) upon a surface 14 (i.e. a device surface) of the substrate 10.

In FIG. 3a, each cavity 12 is formed by a wet or dry etching process using a patterned etch mask (not shown) which can comprise, for example, about 500 nanometers of silicate glass deposited from the decomposition of tetraethylortho silicate (TEOS) and densified by high temperature processing. After etching one or more cavities 12 into the substrate 10, the patterned masking layer can be removed with a selective etchant comprising hydrofluoric acid (HF). If a predetermined depth of the cavity 12 is to exceed more than a few microns, a wet etching process is generally preferred using an anisotropic etchant such as potassium hydroxide (KOH), tetramethyl ammonium hydroxide (TMAH) or ethylenediamine pyrocatechol (EDP). The anisotropic wet etchant can provide sloped sidewalls and a substantially planar bottom surface for the cavity 12 as shown in FIG. 3a. The size and depth of the cavity 12 formed by the etching process will vary depending upon the type and complexity of a particular MEMS device to be formed. However, the size of the cavity 12 will generally have lateral dimensions of up to a few millimeters; and the depth will generally be in the range of about 2–20 microns.

In FIG. 3b, a polishing-stop layer 16 (e.g. about 200–300 nanometers of silicon nitride deposited by low-pressure chemical vapor deposition) is deposited to blanket the substrate surface 14 and the cavity 12 after first forming a thin blanket (about 60 nanometers thick) of a thermal oxide (not shown) to protect the underlying silicon substrate 10 from contact with the layer 16. The use of silicon nitride for the layer 16 is preferred since it is substantially harder than an oxide sacrificial material to be deposited in the cavity 12 and therefore is abraded at a much slower rate than the sacrificial material. In addition, silicon nitride is chemically resistant to the CMP slurry 110 and also to HF which can be used to later etch away the oxide sacrificial material for releasing the MEMS device 200. In this respect, a silicon nitride layer 16 acts as both a polishing stop and an etch stop.

In FIG. 3c, a first functional level of the MEMS device is formed by depositing and patterning a first layer 18 of a micromachinable material (e.g. polysilicon) above layer 16. The first micromachinable layer 18 is generally electrically conductive (e.g. doped polysilicon). It will be understood that the first functional level can be preceded by formation of a ground or voltage reference plane (generally termed a zeroth level) which is not shown in FIGS. 3a–3r for clarity. In FIG. 3d, the layer 18 is micromachined by patterning and anisotropic dry etching (e.g. reactive ion etching with a plasma including $XeF_2$, $SF_6$ or $Cl_2$ for a polysilicon layer 18) to form one or more first-level functional elements 20 of the MEMS device, with the first-level functional elements 20 in some instances being joined, for example, to form an electrostatic comb actuator or sensor. In FIG. 3d, micromachining of the first-level functional elements 20 produces openings or trenches 22 where material has been removed from the layer 18. Micromachining of the first-level functional elements 20 can also a CMP step for locally planarizing an upper surface of the layer 18 (e.g. a polysilicon layer 18) prior to defining the elements 20 by etching. The CMP process step will be described in detail hereinafter for one or more sacrificial layers; but it will be understood by those skilled in the art that a CMP process step can be provided for any recessed layer deposited or formed within the cavity 12, regardless of material composition of that layer.

In FIG. 3e, a sacrificial material (generally comprising a micromachinable material such as silicon dioxide, or a silicate glass such as TEOS) is deposited by one or more chemical vapor deposition (CVD) steps to form a first sacrificial layer 24 that blankets the substrate 10 and preferably covers the first functional level of the MEMS device (e.g. about 2 microns thick). A substantial conformality of the first sacrificial layer 24 with the underlying first-level functional elements 20 of the MEMS device results from the sacrificial material draping into the trenches 22 forming one or more valleys 26 as shown in FIG. 3e. The first sacrificial layer 24 is preferably deposited so that a low point in each valley 26 is higher than the top of the first-level functional elements 20 so that the first sacrificial layer 24 can be locally planarized by CMP to provide a smooth central portion 30 as shown in FIG. 3h above which a second functional level of the MEMS device can be formed.

If the first sacrificial layer 24 were not locally planarized within the cavity 12, the valleys 26 can be replicated in one or more subsequent layers deposited above the first sacrificial layer 24, resulting in a considerable surface topography in the subsequent layers and imposing limitations on subsequent deposition, patterning and etching processes. Therefore, it is advantageous to locally planarize at least a portion of the first sacrificial layer 24 above which a second functional level of the MEMS device is to be formed. Such local planarization alleviates processing difficulties that otherwise can occur due to limitations in photoresist step coverage and photolithographic depth of focus in addition to problems due to stringer generation and potential mechanical interferences with overlying functional levels of the MEMS device 200.

Although CMP can also be used to remove a portion of the first sacrificial layer 24 covering the surface of the semiconductor substrate 10, it is generally preferable to deposit an etch mask 28 (e.g. silicon nitride, polysilicon or photoresist) over the cavity 12 as shown in FIG. 3f and then perform a wet or dry etching step for removing the portion of the layer 24 not covered by the etch mask 28 (i.e. a portion of the layer 24 distal to the cavity 12). The etch mask 28 can then be removed, leaving the first sacrificial layer 24 only proximate to the cavity 12 (see FIG. 3g) for removal by CMR FIG. 3h shows schematically the results of a CMP process step for locally planarizing the first sacrificial layer 24 using a resilient polishing pad 104 and an alkaline silica-based slurry 110 as described heretofore with reference to FIGS. 1 and 2. In FIG. 3h, the first sacrificial layer 24 is preferably planarized to eliminate the valleys 26 especially in a central portion 30 of the layer 24 whereon a second functional level of the MEMS device is to be formed. Residual valleys 26', near the edges of the cavity 12 can remain as shown in FIG. 3h when functional elements of the second functional level are not to be formed above the residual valleys 26', or when these residual valleys 26' will not substantially impair the topography of levels of the MEMS device formed thereabove.

Although the CMP process is shown in FIG. 3h as stopping slightly above the first-level functional elements 20, in some cases, the CMP process can be terminated at the top of the first-level functional elements 20, or even part of the way into the first-level functional elements 20 of the MEMS device. It may also be desirable to locally planarize the sacrificial layer 24 down below a predetermined level and then to deposit a thin layer of the sacrificial material to build up the first sacrificial layer 24 to the predetermined level. An advantage to doing this is that it is generally easier to control the deposition of a thin layer (e.g. 100 nanometers) of the sacrificial material rather than to control the removal of a similar thickness of the sacrificial material by CMP. This is especially advantageous when one or more first-level functional elements 20 must be precisely spaced from other functional elements formed in the second functional level (i.e. second-level functional elements).

In FIG. 3h, the CMP process step also removes the portion of the first sacrificial layer 24 extending upward above the cavity 12 and generally produces a slight rounding of the layer 24 at the sides of the cavity 12 where the resilient polishing pad 104 is urged into the cavity 12 by the force 108 applied between the semiconductor substrate 10 and the polishing pad 104. Some abrasion of the polishing-stop layer 16 can also occur, especially near the cavity 12, but this can be taken into account in determining the thickness required for the polishing-stop layer 16 so that the polishing-stop layer 16 is preferably not completely removed down to the substrate 10. Additional deposition steps can be provided to build up the polishing-stop layer 16 as needed for additional CMP process steps. Additionally, a polishing slurry 110 having a high polishing rate selectivity (i.e. a high rate for removing the sacrificial material as compared to a rate for removing the polishing-stop layer 16) can be used.

After the CMP step for locally planarizing the first sacrificial layer 24, one or more openings 32 and/or dimples 34 can be etched into the layer 24 (e.g. by anisotropic dry etching with a $CH_3F$ plasma) as shown in FIG. 3i. The openings 32 allow electrical or mechanical (i.e. structural) interconnections to be made between the first and second functional levels of the MEMS device; whereas the dimples 34 are useful for preventing stiction.

In FIG. 3j, a second layer 36 of a micromachinable material (e.g. polysilicon; silicon nitride; metals including copper, tungsten, gold, platinum, nickel and palladium; metal alloys, including metal silicides; and combinations thereof) is deposited above the first sacrificial layer 24, generally by CVD, to form the second functional level of the MEMS device. The second layer 36 is deposited conformally, filling in the openings 32 and dimples 34. This can create variations in the surface topography of the layer 36 as shown in FIG. 3j. Additionally, the deposited second layer 36 can have a rough surface finish as in the case of a deposited polysilicon layer 36.

If the resultant surface topography of the layer 36 is detrimental to the operation of the MEMS device (e.g. when a reflecting mirror is to be formed from an upper surface of the layer 36, or when additional functional levels are to be formed above the second functional level), a further CMP process step can be provided to locally planarize the upper surface of the layer 36 to provide a smooth upper surface thereof prior to patterning the layer 36 by anisotropic dry etching to form one or more second-level functional elements 38 as shown schematically in FIG. 3k. Such a further CMP step can, in some instances, require either depositing additional material to build and reinforce the polishing-stop layer 16 (e.g. depositing an additional layer thickness of silicon nitride), or else depositing a second polishing-stop layer (not shown) having a different material composition from the layer 16 to provide an increased chemical resistance to a particular polishing slurry 110 required for chemically-mechanically polishing the second layer 36 of micromachinable material.

In FIG. 3k, the second layer 36 of the micromachinable material with a layer thickness of, for example, about one micron is patterned and anisotropically dry etched to form the second-level functional elements 38. A particular size and shape for the second-level functional elements 38 will depend upon a particular MEMS device to be fabricated. The second-level functional elements 38 can comprise, for example, moveable beams, plates, diaphragms, gears, levers, linkages, actuators, or combinations thereof.

In FIG. 3l, after patterning the second-level functional elements 38, a second layer 40 of sacrificial material (generally having the same composition as the first sacrificial layer 24) can be blanket deposited to cover the second-level functional elements 38. The second sacrificial layer 40 can be locally planarized in the same manner as described heretofore for the first sacrificial layer 24 when additional functional levels are to be formed for the MEMS device. Otherwise, the second sacrificial layer 40 can be deposited to over-fill the cavity 12 as shown in FIG. 3l so that a step can be provided for globally planarizing the entire semiconductor substrate 10.

FIG. 3m shows the MEMS device 200 after the global planarization step which removes the second sacrificial layer 40 down to the level of the polishing-stop layer 16 and leaves the MEMS device 200 encapsulated in the sacrificial material. The global planarization step can be performed entirely by a CMP process step. Alternately, a patterned etch mask can be provided to blanket the cavity 12 similar to the mask 28 described herebefore with reference to FIG. 3f so that a separate wet or dry etching step can be used to remove the sacrificial material from the semiconductor substrate 10 (i.e. to remove a portion of the layer 40 distal to the cavity 12) except for a portion of the second sacrificial layer 40 overlying the cavity 12 (i.e. a portion of the layer 40 proximate to the cavity 12). The etch mask can then be removed, and a CMP step can be provided to remove the remaining portion of the second sacrificial layer 40 overlying the cavity 12 down to the polishing-stop layer 16.

In FIG. 3n a cap layer 42 (e.g. silicon nitride) can be blanket deposited over the cavity 12 to seal the cavity. After sealing the cavity 12 with the cap layer 42, an annealing step can be provided to relieve any stress in the functional levels of the MEMS device 200. The annealing step can be performed by heating the semiconductor substrate 10 and the encapsulated MEMS device 200 to a predetermined temperature in the range of about 700–1300° C. for a time period of up to several hours depending upon the level of stress to be relieved.

Electrical interconnections to the encapsulated MEMS device can be provided by anisotropically etching down to one or more of the functional levels of the MEMS device 200 and depositing a conductive material (e.g. doped polysilicon, a metal or a metal alloy) to form contact studs 44 as shown in FIG. 3o. This electrical interconnection step can be performed by anisotropically etching through the cap layer 42 and the sacrificial material. Alternately, the cap layer 42 can be removed prior to anisotropically etching down through the sacrificial material and forming wells 46 therein. The cap layer 42 can then be re-deposited over the cavity and in the wells 46 to protect the contact studs 44 during a later etch release step. Another anisotropic dry etching step can then be used to etch through the cap layer 42 at the bottom of each well 46 thereby exposing the functional level of the MEMS device for forming an electrical interconnection thereto. The conductive material can then be deposited in the wells 46 to form the contact studs 44. A step for forming a patterned metallization 48 above the substrate 10 can then be used to provide a plurality of bonding pads interconnected to the contact studs 44 as shown in FIG. 3p. Multiple layers of the patterned metallization 48 can be separated by dielectric layers. In some instances the contact studs 44 and patterned metallization 48 can be formed with a single deposition step.

In FIG. 3q, a protection layer 50 can be deposited to blanket the substrate 10 for protection of the patterned metallization 48 during an etch release step that releases the MEMS device 200 into its final suspended state for operation thereof. The protection layer 50 comprises a material (e.g. a hardened photoresist, polyimide, silicon nitride, a metal or a metal alloy) that is chemically resistant to a selective wet etchant (e.g. a buffered oxide etchant comprising HF, or a mixture of HF and HCl) that is used to etch away at least a portion of the sacrificial material (i.e. the layers 24 and 40) for releasing the MEMS device 200.

After deposition of the protection layer 50, the etch release step proceeds by etching a plurality of spaced etch channels 52 down through the various layers overlying the second sacrificial layer 40 to expose portions of the second sacrificial layer 40 as shown in FIG. 3r. The etch channels 52 can be about 1–1000 microns diameter, depending on the particular type of MEMS device 200 to be formed, and whether the etch channels 52 will later be plugged (e.g. by a silicon nitride deposition step) for forming a sealed cavity containing the MEMS device 200.

The selective wet etchant used for releasing the MEMS device 200 dissolves the sacrificial material (e.g. silicon dioxide or a silicate glass such as TEOS) without affecting other materials (e.g. polysilicon, silicon nitride, metals, metal alloys, resist, polyimide) used for forming and protecting the MEMS device 200. Up to several hours of etching can be required for the etch release step to remove all of the sacrificial material from the cavity 12. In some instances, the etch release step can be timed so that less than all of the sacrificial material is removed as shown in FIG. 3r where only a central portion of the sacrificial layers 24 and 40 near the etch channels 52 has been removed by etching. In these instances, the remaining sacrificial material can be left to support the contact studs 44 or other functional elements in one or more of the functional levels of the MEMS device 200. In order to control the etch release process, the locations of the etch channels 52 and the composition of the selective wet etchant can be selected to limit a lateral extent of etching of the sacrificial material, thereby leaving portions of the sacrificial material surrounding the contact studs 44 and/or the other functional elements of the MEMS device 200.

After the etch release step, the substrate 10 can be washed and dried, preferably using one of the stiction-free drying methods known to the art. The protection layer 50 can either be removed entirely, or in part, to expose the bonding pads for packaging the MEMS device 200 by methods well known in the art. To form a sealed-cavity MEMS device 200, the etch channels 52 can be plugged with deposited silicon nitride.

Figure 4A:
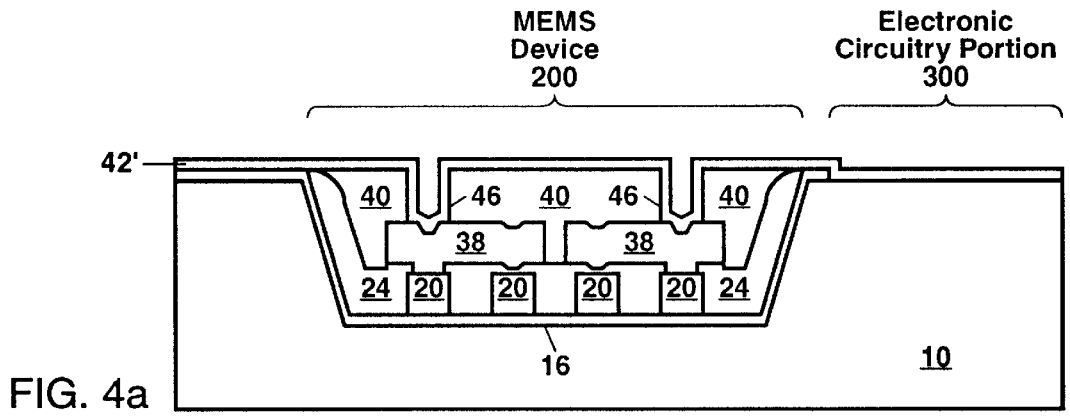
FIGS. 4$a$, 4$b$, and 4$c$ show schematic cross-section views of an additional series of process steps that can be used with the micromachining steps of FIGS. 3$a$–3$m$ to form electronic circuitry integrated with the recessed MEMS device.
Figure 4B:
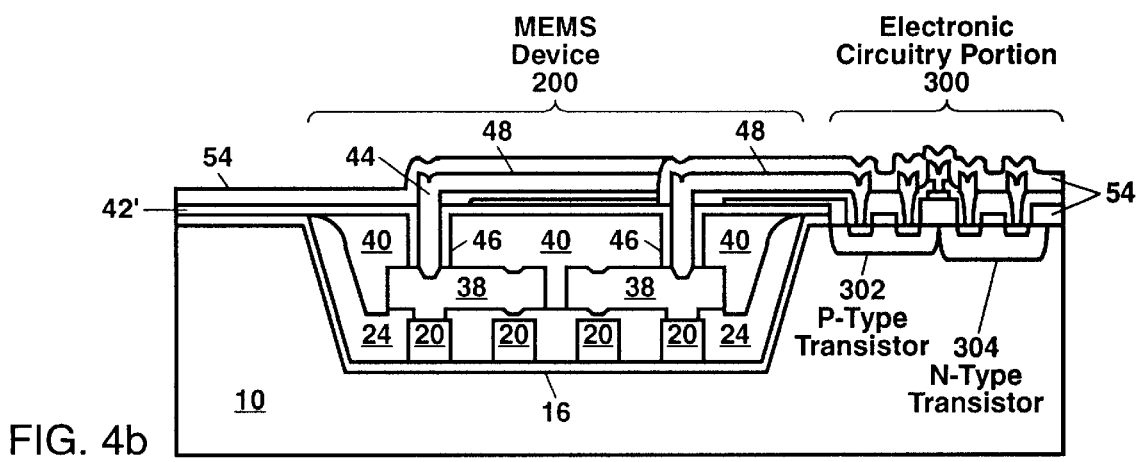
Figure 4C:
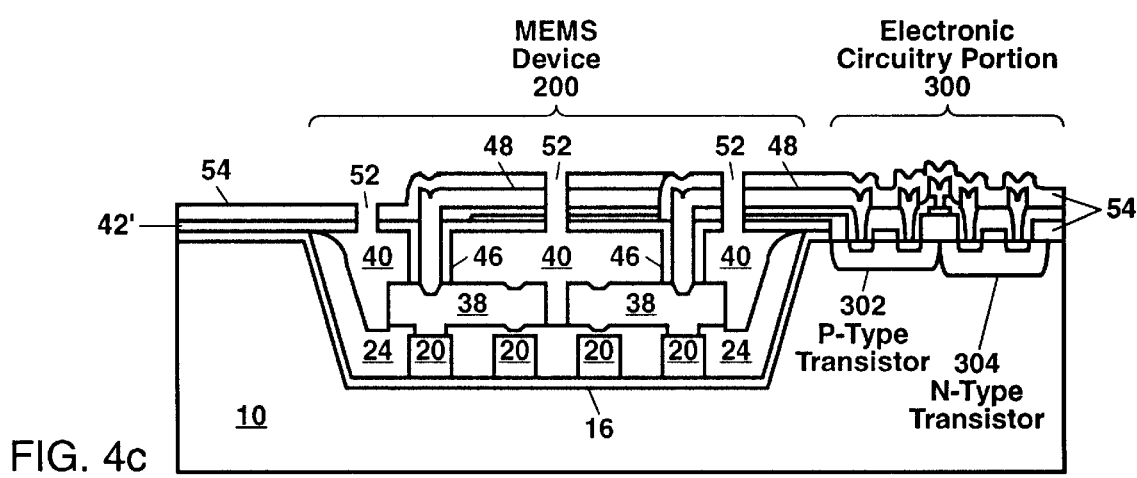

In some preferred embodiments of the present invention, the MEMS device can be integrated with electronic circuitry by providing additional process steps as illustrated schematically in FIGS. 4a–4c. The formation of integrated electronic circuitry (e.g. CMOS, BiCMOS or bipolar electronic circuitry) can comprise up hundreds of individual steps which are well known in the art and which have been standardized in the integrated circuit (IC) industry. Therefore, for clarity, only a few steps that are relevant to the present invention are discussed herein. Furthermore, this example of forming a MEMS device 200 integrated with electronic circuitry formed on the same substrate 10 is provided by way of illustration only, and is not meant to limit the present invention.

The formation of the electronic circuitry comprising a plurality of transistors can begin immediately after the step for globally planarizing the substrate as described heretofore with reference to FIG. 3m. A plurality of wells 46 can be anisotropically etched through the second sacrificial layer 40 to one or more functional levels of the MEMS device 200. Then the polishing-stop layer 42 and the underlying thermal oxide can be removed by etching to expose a portion 300 of the substrate whereon the electronic circuitry is to be formed. Removal of the polishing-stop layer 42 and the underlying thermal oxide allows a new thermal oxide layer (not shown) and a new cap layer 42' to be formed with precise thicknesses as are generally required for forming electronic circuitry (e.g. CMOS, BiCMOS, or bipolar electronic circuitry). The new thermal oxide layer can be, for example, about 60 nanometers thick and the new cap layer 42' can comprise, for example, about 120 nanometers of silicon nitride. The silicon nitride can be blanket deposited over the entire substrate and in the wells 46 as shown in FIG. 4a using a low-pressure CVD process.

In FIG. 4b, the electronic circuitry is formed on the substrate 10 in the portion 300 using methods that are well known in the art. A plurality of openings can be formed through the cap layer 42' for forming n-type and p-type isolation wells (also termed tubs) by ion implantation and thermal diffusion steps. Subsequent process steps can be used to form a plurality of p-type transistors 302 in the n-type wells and n-type transistors 304 in the p-type wells. One or more polysilicon layers can then be deposited and patterned to form transistor gates and resistors. One or more dielectric passivation layers 54 can then be deposited or spun on over the transistors, 302 and 304, and the MEMS device 200 for protection thereof. Openings can be etched through the passivation layers 54 and the cap layer 42' above the MEMS device so that the contact studs 44 can be formed by a deposition step as described heretofore with reference to FIG. 3o.

One or more layers of patterned metallization 48 can then be formed to interconnect the various elements (e.g. transistors, resistors, capacitors) of the electronic circuitry, to interconnect the electronic circuitry to the MEMS device 200 and to form a plurality of bonding pads. Aluminum or an alloy thereof is preferred for use as the interconnect metallization 48, although other metals (e.g tungsten, gold, copper, platinum, nickel, palladium), metal alloys (including metal silicides) and even doped polysilicon can be used for the electrical interconnections depending upon particular operating requirements for the device. Multiple layers of the patterned metallization 48 can be separated by dielectric layers 54 (e.g. about 200 nanometers of a silicate glass such as plasma-enhanced TEOS, also termed PETEOS) which can also be deposited above the electronic circuitry portion 300 and MEMS device 200 for protection and stress relief.

After fabrication of the electronic circuitry is substantially completed, a protection layer 50 as described herebefore with reference to FIG. 3q can be deposited to blanket the substrate 10 for protection of the electronic circuitry during an etch release step that releases the MEMS device 200 into its final suspended state for operation thereof. After deposition of the protection layer 50, the etch release step then proceeds by etching a plurality of spaced etch channels 52 down through the various layers overlying the second sacrificial layer 40 as described heretofore with reference to FIG. 3r. Exposing the substrate 10 to the selective wet etchant (e.g. an HF:HCl etchant mixture) for a predetermined time period then dissolves away at least a portion of the sacrificial material for releasing the MEMS device 200.

After the etch release step, the substrate 10 can be washed and dried, an optional deposition step can be provided to plug the etch channels 52, and the protection layer 50 removed entirely, or in part, to expose the bonding pads. The completed MEMS device 200 integrated with electronic circuitry can then be packaged using methods known to the art.

The matter set forth in the foregoing description and accompanying drawings is offered by way of illustration only and not as a limitation. Although the method of the present invention finds its most common application in the local planarization of sacrificial layers and silicon-based functional levels, the method can be applied to any recessed layers within a cavity for forming a MEMS device, including layers comprising photoresist, polyimide, silicon nitride, metals and metal alloys. Furthermore, the method of the present invention can also be applied to bulk micromachining processes, including LIGA, for forming larger-sized MEMS devices in a cavity. The actual scope of the invention is intended to be defined in the following claims when viewed in their proper perspective based on the prior art.

What is claimed is:

1. A method of micromachining a multilayer microelectromechanical system (MEMS) device comprising steps for:
   (a) forming a cavity below a surface of a semiconductor substrate;
   (b) forming a first level of the MEMS device within the cavity;
   (c) depositing a first layer of a sacrificial material for blanketing the first level of the MEMS device;
   (d) locally planarizing at least a portion of an upper surface of the first layer of sacrificial material within the cavity by chemical-mechanical polishing the first layer of sacrificial material; and
   (e) forming a second level of the MEMS device within the cavity above the first layer of sacrificial material and operatively connecting the second level of the MEMS device to the first level thereof.

2. The method of claim 1 wherein the semiconductor substrate comprises silicon.

3. The method of claim 1 wherein the sacrificial material comprises silicon dioxide or a silicate glass.

4. The method of claim 1 wherein the steps for forming the first and second levels of the MEMS device includes depositing and patterning at least one micromachinable material selected from the group consisting of polysilicon, silicon nitride, metals and metal alloys.

5. The method of claim 4 wherein the steps for forming the first and second levels of the MEMS device further includes chemically-mechanically polishing an upper surface of the micromachinable material in at least one level of the MEMS device.

6. The method of claim 1 further including a step for depositing a polishing-stop layer on the surface of the semiconductor substrate.

7. The method of claim 6 wherein the polishing-stop layer extends into the cavity forming an etch-stop layer within the cavity.

8. The method of claim 6 wherein the polishing-stop layer comprises silicon nitride.

9. The method of claim 1 wherein the step for depositing the first layer of sacrificial material comprises blanket depositing the first layer of sacrificial material over the substrate.

10. The method of claim 9 further including a step for removing a portion of the first layer of sacrificial material outside the cavity by etching.

11. The method of claim 1 further including a step for patterning the first layer of sacrificial material within the cavity prior to the step for forming the second level of the MEMS device.

12. The method of claim 1 further including a step for depositing a second layer of the sacrificial material for blanketing the second level of the MEMS device.

13. The method of claim 12 further including steps for forming a patterned metallization above the substrate and electrically interconnecting the patterned metallization with the first and second levels of the MEMS device.

14. The method of claim 12 further including a step for locally planarizing at least a portion of the upper surface of the second layer of sacrificial material and recessing the second layer below the surface of the semiconductor substrate by chemical-mechanical polishing the second layer of sacrificial material.

15. The method of claim 12 wherein the step for depositing the second layer of the sacrificial material comprises blanket depositing the sacrificial material over the substrate and over-filling the cavity with the deposited sacrificial material.

16. The method of claim 15 further including a step for globally planarizing the semiconductor substrate by chemically-mechanically polishing the substrate and removing the deposited sacrificial material outside the cavity.

17. The method of claim 16 further including steps for forming electronic circuitry on the surface of the semiconductor substrate, and for electrically interconnecting the electronic circuitry to the MEMS device.

18. The method of claim 15 further including a step for globally planarizing the semiconductor substrate by removing a first portion of the second layer of sacrificial material distal to the cavity by etching, and by removing a second portion of the sacrificial layer proximate to the cavity by chemically-mechanically polishing.

19. The method of claim 18 further including steps for forming electronic circuitry on the surface of the semiconductor substrate, and for electrically interconnecting the electronic circuitry with the MEMS device.

20. A MEMS device formed according to the method of claim 1.

21. A method of micromachining a multilayer microelectromechanical system (MEMS) device comprising steps for:
   (a) forming a cavity below a surface of a semiconductor substrate;
   (b) forming a first level of the MEMS device within the cavity by depositing and patterning a first layer of a micromachinable material;
   (c) depositing a first layer of a sacrificial material within the cavity and covering the first level of the MEMS device;
   (d) chemically-mechanically polishing the first layer of sacrificial material and forming a smooth central portion thereof above the first level of the MEMS device and recessed below the surface of the semiconductor substrate;
   (e) forming a second level of the MEMS device within the cavity by depositing and patterning a second layer of the same or a different micromachinable material above the first sacrificial layer; and
   (f) depositing a second layer of the sacrificial material above the second level of the MEMS device.

22. The method of claim 21 wherein the semiconductor substrate comprises silicon.

23. The method of claim 21 wherein the sacrificial oxide layer comprises silicon dioxide or a silicate glass.

24. The method of claim 21 wherein each micromachinable material is selected from the group consisting of polysilicon, silicon nitride, metals and metal alloys.

25. The method of claim 24 wherein the steps for forming the first and second levels of the MEMS device further includes chemically-mechanically polishing an upper surface of the first or second layers of micromachinable material.

26. The method of claim 21 further including a step for depositing a silicon nitride layer on the surface of the semiconductor substrate and within the cavity prior to forming the first level of the MEMS device.

27. The method of claim 21 further including a step for patterning the first sacrificial layer by etching after the step for chemically-polishing the first sacrificial layer and forming the smooth central portion thereof, and prior to the step for forming the second level of the MEMS device.

28. The method of claim 21 further including a step for planarizing the second sacrificial layer.

29. The method of claim 28 further including steps for forming electrical interconnections through the first and second sacrificial layers to the first and second levels of the MEMS device.

30. The method of claim 28 further including steps for forming electronic circuitry on the semiconductor substrate and electrically interconnecting the electronic circuitry with the MEMS device.

31. A MEMS device formed according to the method of claim 21.

32. A method of micromachining a multilayer microelectromechanical system (MEMS) device comprising steps for:

(a) forming a cavity below a surface of a silicon substrate;

(b) depositing and patterning a first layer of polysilicon recessed within the cavity for forming a first level of the MEMS device;

(c) depositing a first sacrificial layer comprising silicon dioxide or silicate glass recessed within the cavity and covering the first polysilicon layer;

(d) chemically-mechanically polishing the first sacrificial layer for substantially planarizing at least a portion of the recessed first sacrificial layer; and (e) depositing and patterning a second layer of polysilicon within the cavity for forming a second level of the MEMS device.

33. The method of claim 32 further including a step for chemically-mechanically polishing at least one of the polysilicon layers.

34. The method of claim 32 further including a step for depositing a silicon nitride layer over the silicon substrate and within the cavity prior to the step for depositing and patterning the first layer of polysilicon.

35. The method of claim 32 further including a step for patterning the first sacrificial layer after the step for chemically-mechanically polishing the first sacrificial layer, and prior to the step for depositing and patterning the second layer of polysilicon.

36. The method of claim 32 further including a step for depositing a second sacrificial layer comprising silicon dioxide or silicate glass over the second polysilicon layer.

37. The method of claim 36 further including a step for planarizing the second sacrificial layer.

38. The method of claim 37 wherein the second sacrificial layer over-fills the cavity, and the step of planarizing the second sacrificial layer globally planarizes the silicon substrate.

39. The method of claim 38 further including steps for forming a patterned metallization above the silicon substrate and electrically interconnecting the patterned metallization with the first and second polysilicon layers.

40. The method of claim 38 further including steps for forming electronic circuitry on the silicon substrate and electrically interconnecting the electronic circuitry with the MEMS device.

41. The method of claim 40 wherein the electronic circuitry is selected from the group consisting of CMOS electronic circuitry, BiCMOS electronic circuitry and bipolar electronic circuitry.

42. A MEMS device formed according to the method of claim 32.

* * * * *